United States Patent
Houston

(10) Patent No.: US 8,164,945 B2
(45) Date of Patent: Apr. 24, 2012

(54) 8T SRAM CELL WITH TWO SINGLE SIDED PORTS

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/782,902

(22) Filed: May 19, 2010

(65) Prior Publication Data

US 2010/0296336 A1 Nov. 25, 2010

Related U.S. Application Data

(60) Provisional application No. 61/180,312, filed on May 21, 2009.

(51) Int. Cl.
*G11C 11/00* (2006.01)
(52) U.S. Cl. .................. 365/156; 365/154; 365/189.14; 365/189.11
(58) Field of Classification Search .................. 365/156, 365/154, 189.14, 189.11, 230.05, 230.06
See application file for complete search history.

(56) References Cited

U.S. PATENT DOCUMENTS 7,596,013 B2 * 9/2009 Yamaoka et al. ............. 365/154

* cited by examiner

*Primary Examiner* — David Lam
(74) *Attorney, Agent, or Firm* — Rose Alyssa Keagy; Wade J. Brady, III; Frederick J. Telecky, Jr.

(57) ABSTRACT

A dual port SRAM cell includes an auxiliary driver transistor on each data node. The SRAM cell is capable of single sided write to each data node. The auxiliary driver transistors in addressed cells may be biased independently of half-addressed cells. During write and read operations, the auxiliary driver transistors may be floated or biased. Auxiliary driver transistors in half-addressed SRAM cells may be biased. During standby modes, the auxiliary driver transistors may be floated. During sleep modes, the auxiliary driver transistors may be biased at reduced voltages. The auxiliary driver transistors in each cell may be independent or may have a common source node within each cell. Additional single sided write ports and read buffers may be added. A process of operating an integrated circuit that includes performing a single-sided write bit-side low, a single-sided write bit-side high, and a read bit-side operation.

20 Claims, 10 Drawing Sheets

8T SRAM CELL WITH TWO SINGLE SIDED PORTS

CROSS-REFERENCE TO RELATED APPLICATIONS

This application claims the benefit of priority under U.S.C. §119(e) of U.S. Provisional Application 61/180,312 (and entitled "An 8T SRAM Cell With 2 Single Sided Ports"), filed May 21, 2009, the entirety of which is incorporated herein by reference.

Furthermore, this application is related to:

U.S. patent application Ser. No. 12/782,908 (, filed May 19, 2010) entitled "8T SRAM Cell With Four Load Transistors,"

U.S. patent application Ser. No. 12/782,874 (, filed May 19, 2010) entitled "6T SRAM Cell With Single Sided Write,"

U.S. patent application Ser. No. 12/782,894 (, filed May 19, 2010) entitled "Asymmetric SRAM Cell With Split Transistors On The Strong Side,"

U.S. patent application Ser. No. 12/782,941 (, filed May 19, 2010) entitled "8T SRAM Cell With One Word Line," and U.S. patent application Ser. No. 12/782,927 (, filed May 19, 2010) entitled "SRAM Cell for Single Sided Write."

With their mention in this section, these patent applications are not admitted to be prior art with respect to the present invention; U.S. patent application Ser. No. 12/782,902 (, filed May 19, 2010).

FIELD OF THE INVENTION

This invention relates to the field of integrated circuits. More particularly, this invention relates to static random access memories (SRAMs) in integrated circuits.

DETAILED DESCRIPTION

Figure 1:
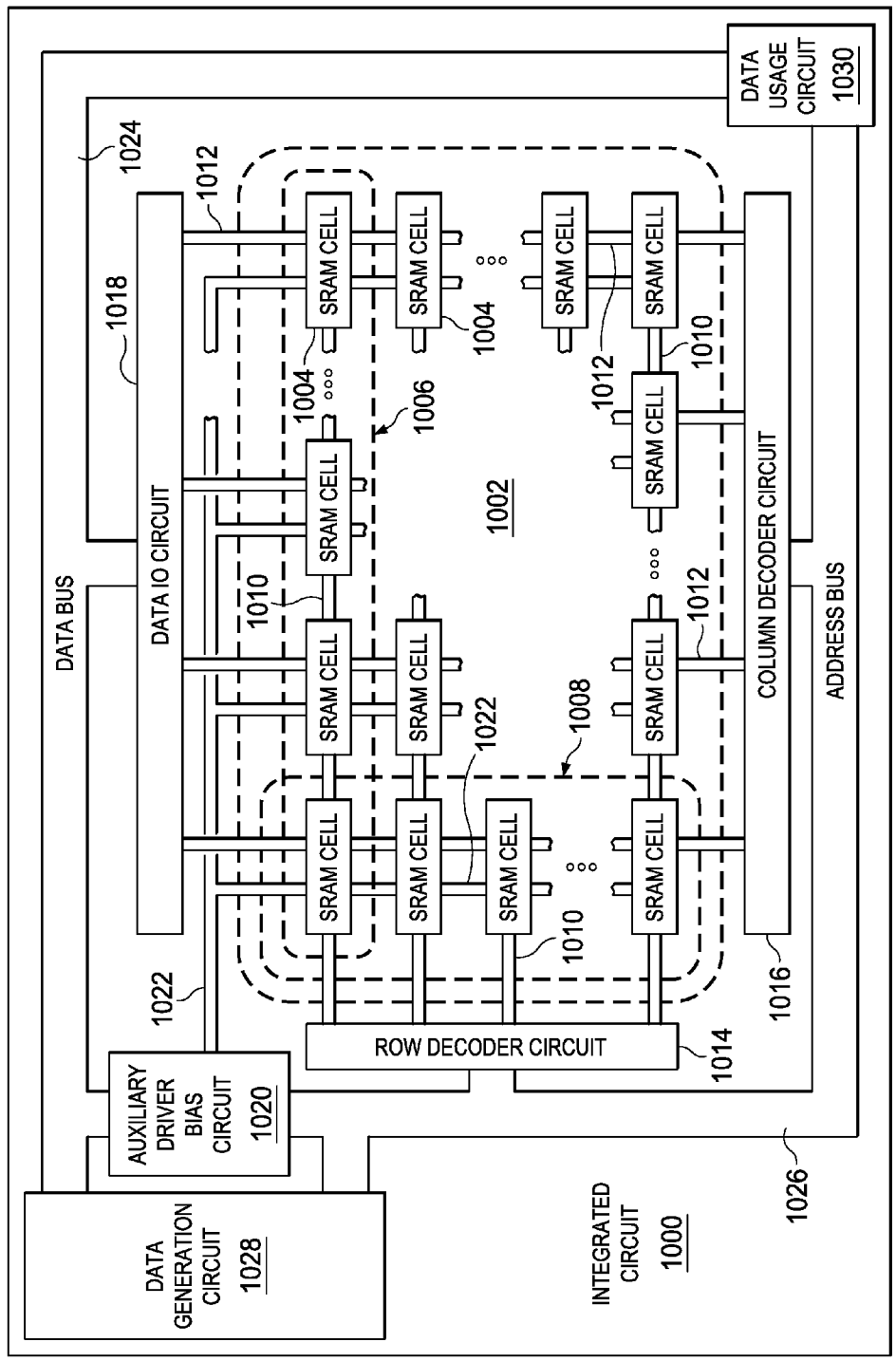
FIG. 1 depicts an integrated circuit containing an SRAM cell array which includes SRAM cells formed according to an embodiment.

Example embodiments described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide an understanding of the example embodiments. One skilled in the relevant art, however, will readily recognize that embodiments can be practiced without one or more of the specific details or with other methods. In other instances, well-known structures or operations are not shown in detail to avoid obscuring an embodiment. The example embodiments are not limited by the illustrated ordering of acts or events, as some acts may occur in different orders and/or concurrently with other acts or events. Furthermore, not all illustrated acts or events are required to implement a methodology in accordance with an embodiment.

For the purposes of this disclosure, the term "Vdd" is understood to refer to a power supply node with a voltage suitable for source nodes of p-channel metal oxide semiconductor (PMOS) transistors. Similarly, the term "Vss" is understood to refer to a power supply node with a voltage suitable for source nodes of n-channel metal oxide semiconductor (NMOS) transistors, and is lower than the Vdd voltage. The term "floated" is understood to mean disconnected from a voltage source such as Vdd or Vss, or connected to a voltage source through a high impedance, for example a transistor, a resistor or a diode, so as to limit charge accumulation on a floated node.

For the purposes of this disclosure, the term "Vtn" is understood to mean an average threshold voltage of NMOS transistors in inverters of SRAM cells. The term "Vtp" is understood to mean an average threshold voltage magnitude of PMOS transistors in inverters of SRAM cells.

In this disclosure, the term "driver transistor" is understood to refer to a metal oxide semiconductor (MOS) transistor, possibly a finFET transistor or a carbon nanotube transistor (CNT), in an SRAM cell. A drain node of the driver transistor is connected to a data node of the SRAM cell. A gate node of the driver transistor is connected to an opposite data node of the SRAM cell from the driver transistor drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge voltage of a corresponding data line which is connected to the driver transistor through a passgate transistor; that is, SRAM cells in arrays which pre-charge data lines to a high voltage have NMOS driver transistors, while SRAM cells in arrays which pre-charge data lines to a low voltage have PMOS driver transistors.

Similarly, the term "load transistor" is understood to refer to another MOS transistor, possibly a finFET transistor or a CNT, in the SRAM cell. A drain node of the load transistor is connected to a data node of the SRAM cell. A gate node of the load transistor is connected to an opposite data node of the SRAM cell from the load transistor drain node. A source node of the load transistor is connected to a power supply node, typically either Vdd for PMOS load transistors or Vss for NMOS load transistors. A polarity of the load transistor source node power supply is the same as the polarity of a read operation pre-charge voltage of a corresponding data line which is connected to the driver transistor through a passgate transistor; that is, SRAM cells in arrays which pre-charge data lines to a voltage above Vss have PMOS load transistors, while SRAM cells in arrays which pre-charge data lines to a voltage below Vdd have NMOS load transistors.

The term "passgate transistor" is understood to refer to yet another MOS transistor, possibly a finFET transistor or a CNT, in the SRAM cell, of which one source/drain node is connected to a data node of the SRAM cell and an opposite source/drain node is connected to a corresponding data line of the SRAM cell. Similarly, the term "access transistor" is understood to refer to an MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

The term "word line" is understood to mean an interconnect element connected to gate nodes of passgate transistors and/or access transistors in a row of SRAM cells. The terms "bit line" and "bit-bar line" are understood to refer to data lines connected to passgate transistors or read buffers in a column of SRAM cells.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while a bit line is disconnected from read or write circuitry.

In some instances of integrated circuits containing SRAM cell arrays, substantially all circuits in the integrated circuit are dedicated to operation of the SRAM array. In these instances, the circuits which provide data to be stored in the SRAM array and circuits which use data from the SRAM array are located outside the integrated circuit containing the SRAM array. In other instances of integrated circuits containing SRAM cell arrays (such as microprocessors, digital signal processors and wireless telephony controllers), the circuits which provide data to be stored in the SRAM array and the circuits which use data from the SRAM array are located in the integrated circuit.

An example embodiment (FIG. 1) provides an integrated circuit containing an array of SRAM cells arranged in rows and columns. Each SRAM cell contains cross-coupled inverters, in which each inverter includes a driver transistor, a load transistor and an auxiliary driver transistor. Source nodes of the auxiliary driver transistors may be biased by column, independently of each other and independently of the driver transistors. Each SRAM cell further contains a passgate transistor on each data node. Gate nodes of the passgate transistors are connected to separate, independent word lines. The SRAM cell is capable of single sided write operations through each passgate transistor. Additional single sided write ports or read buffers may be added to the inventive SRAM cell.

During single sided write operations, the source nodes of the auxiliary driver transistors in addressed SRAM cells may be floated to reduce interference with data transfer from bit lines to the addressed SRAM cells, or may be biased to assist data transfer from bit lines to data nodes in the addressed SRAM cells. The source nodes of the auxiliary driver transistors in half-addressed SRAM cells may be biased to possibly reduce data upsets during the write operations.

During read operations, the source nodes of the auxiliary driver transistors in addressed SRAM cells may be biased to improve static noise margin values in the addressed SRAM cells. The source nodes of the auxiliary driver transistors in half-addressed SRAM cells may be biased to possibly reduce data upsets during the read operations.

During standby modes (in which biases on source nodes of the driver and driver transistors are maintained at voltages substantially equivalent to those during read and write operations), the source nodes of the auxiliary driver transistors may be floated to possibly reduce leakage current in the SRAM cells.

During sleep modes (in which the voltage difference across the driver and driver transistors are lowered to reduce power consumption in the SRAM cell array), the source nodes of the auxiliary driver transistors may be biased to possibly improve data retention in the SRAM cells.

FIG. 1 depicts an integrated circuit (1000) containing an SRAM cell array (1002) which includes SRAM cells (1004) formed according to one embodiment. The SRAM cells (1004) are arranged in rows (1006) and columns (1008). Each word line bus (1010) is connected to SRAM cells (1004) in a row (1006), and each word line bus (1010) may include more than one word line. Each bit line bus (1012) is connected to SRAM cells (1004) in a column (1008), and each bit line bus (1012) may include one or more bit or bit-bar lines. A row decoder circuit (1014) applies appropriate biases to word lines in the word line buses (1010). A column decoder circuit (1016) applies appropriate biases to bit or bit-bar lines in the bit line buses (1012). A data input/output (IO) circuit (1018) reads data from the bit or bit-bar lines in the bit line buses (1012) during read operations and applies appropriate voltages to the bit or bit-bar lines in the bit line buses (1012) during single sided write operations. An auxiliary driver transistor bias circuit (1020) applies biases to an auxiliary driver bus (1022) which is connected to auxiliary driver transistors in the SRAM cells (1004). The auxiliary driver transistor bias circuit (1020) is capable of biasing the auxiliary driver transistors independently by column. The integrated circuit further includes a data bus (1024) which carries data bits between the SRAM cell array (1002) and other circuits in the integrated circuit (1000), and an address bus (1026) which is used to select SRAM cells (1004) in the SRAM cell array (1002) for read and write operations. The address bus (1026) is connected to the row decoder circuit (1014), the column decoder circuit (1016) and the auxiliary driver transistor bias circuit (1020). The integrated circuit (1000) may also contain a data generation circuit (1028) which connects to the data bus (1024) and address bus (1026). The data generation circuit (1028) produces incoming data bits for storage in the SRAM cell array (1002). The data bus (1024) carries the incoming data bits from the data generation circuit (1028) to the SRAM cell array (1002). The integrated circuit (1000) may also contain a data usage circuit (1030) which connects to the data bus (1024) and address bus (1026). The data usage circuit (1030) uses outgoing data bits which were stored in the SRAM cell array (1002). The data bus (1024) carries the outgoing data bits from the SRAM cell array (1002) to the data usage circuit (1030).

Figure 2:
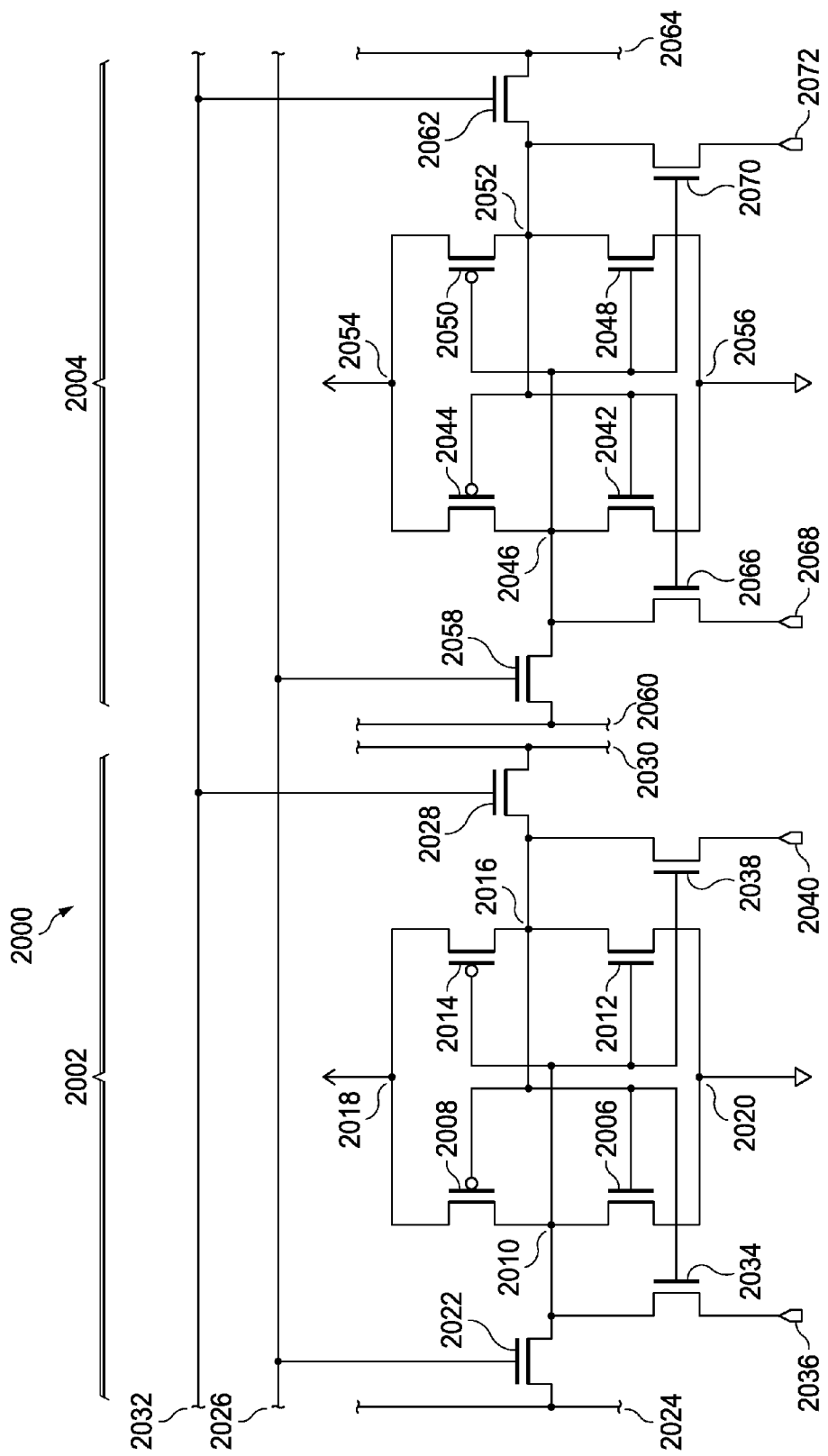
FIG. 2 is a circuit diagram of an SRAM cell array in an integrated circuit.

FIG. 2 is a circuit diagram of an SRAM cell array portion (2000) in an integrated circuit. The SRAM cell array portion (2000) contains a first SRAM cell (2002) and a second SRAM cell (2004) in a same row of the SRAM cell array portion (2000) as the first SRAM cell (2002). The first SRAM cell (2002) includes an NMOS first bit-side driver transistor (2006) commonly known as a first bit driver (2006) and a PMOS first bit-side load transistor (2008) commonly known as a first bit load (2008). A drain node of the first bit driver (2006) and a drain node of the first bit load (2008) are connected to a first bit-side data node (2010). The first SRAM cell (2002) also includes an NMOS first bit-bar-side driver transistor (2012) commonly known as a first bit-bar driver (2012) and a PMOS first bit-bar-side load transistor (2014) commonly known as a first bit-bar load (2014). A drain node of the first bit-bar driver (2012) and a drain node of the first bit-bar load (2014) are connected to a first bit-bar-side data node (2016). A source node of the first bit load (2008) and a source node of the first bit-bar load (2014) are connected to a first Vdd node (2018). A source node of the first bit driver (2006) and a source node of the first bit-bar driver (2012) are connected to a first Vss node (2020). A gate node of the first bit driver (2006) and a gate node of the first bit load (2008) are connected to the first bit-bar-side data node (2016). Similarly, a gate node of the first bit-bar driver (2012) and a gate node of the first bit-bar load (2014) are connected to the first bit-side data node (2010). The first bit driver (2006), the first bit-side data node (2010) and the first bit load (2008), with connected gate nodes, form a first bit inverter. Similarly, the first bit-bar driver (2012), the first bit-bar-side data node (2016) and the first bit-bar load (2014), with connected gate nodes, form a first bit-bar inverter. The configuration in which the gate nodes of the first bit inverter are connected to the first bit-bar-side data node (2016) while the gate nodes of the first bit-bar inverter are connected to the first bit-side data node (2010) is known as cross-coupled inverters.

The first SRAM cell (2002) further includes a first bit-side passgate transistor (2022). A first source/drain node of the first bit-side passgate transistor (2022) is connected to the first bit-side data node (2010). A second source/drain node of the first bit-side passgate transistor (2022) is connected to a first bit line (2024). The first bit line (2024) is also connected to source/drain nodes of bit-side passgate transistors in other SRAM cells (not shown) in a same column as the first SRAM cell (2002). A gate node of the first bit-side passgate transistor (2022) is connected to a first word line (2026).

Furthermore, the first SRAM cell (2002) includes a first bit-bar-side passgate transistor (2028). A first source/drain node of the first bit-bar-side passgate transistor (2028) is connected to the first bit-bar-side data node (2016). A second source/drain node of the first bit-bar-side passgate transistor (2028) is connected to a first bit-bar line (2030). The first bit-bar line (2030) is also connected to source/drain nodes of bit-bar-side passgate transistors in other SRAM cells (not shown) in a same column as the first SRAM cell (2002). A gate node of the first bit-bar-side passgate transistor (2028) is connected to a second word line (2032).

Moreover, the first SRAM cell (2002) includes an NMOS first bit-side auxiliary driver transistor (2034). A drain node of the first bit-side auxiliary driver transistor (2034) is connected to the first bit-side data node (2010). A gate node of the first bit-side auxiliary driver transistor (2034) is connected to the first bit-bar-side data node (2016). A source node (2036) of the first bit-side auxiliary driver transistor (2034) is connected to other source nodes of bit-side auxiliary driver transistors in other SRAM cells (not shown) in a same column as the first SRAM cell (2002). Similarly, the first SRAM cell (2002) also includes an NMOS first bit-bar-side auxiliary driver transistor (2038). A drain node of the first bit-bar-side auxiliary driver transistor (2038) is connected to the first bit-bar-side data node (2016). A gate node of the first bit-bar-side auxiliary driver transistor (2038) is connected to the first bit-side data node (2010). A source node (2040) of the first bit-bar-side auxiliary driver transistor (2038) is connected to other source nodes of bit-bar-side auxiliary driver transistors in other SRAM cells (not shown) in a same column as the first SRAM cell (2002).

In one embodiment, a sum of on-state currents of the first bit driver (2006) and the first bit-side auxiliary driver transistor (2034) is greater than an on-state current of the first bit-side passgate transistor (2022). In addition, a sum of on-state currents of the first bit-bar driver (2012) and the first bit-bar-side auxiliary driver transistor (2038) is greater than an on-state current of the first bit-bar-side passgate transistor (2028). In a further embodiment, the driver transistors (2006, 2012) and the load transistors (2008, 2014) are a minimum width consistent with fabrication methods used to manufacture the SRAM array (2000). Minimizing driver and load transistor widths may reduce a size of the SRAM array (2000) and thereby possibly reduce manufacturing costs of the integrated circuit.

The second SRAM cell (2004) includes a second bit driver (2042) and a second bit load (2044) connected at a second bit-side data node (2046) (as in the first SRAM cell (2002)). Similarly, the second SRAM cell (2004) includes a second bit-bar driver (2048) and a second bit-bar load (2050) connected at a second bit-bar-side data node (2052). Gate nodes of the second bit driver (2042) and second bit load (2044) are connected to the second bit-bar-side data node (2052). Similarly, gate nodes of the second bit-bar driver (2048) and second bit-bar load (2050) are connected to the second bit-side data node (2046). Source nodes of the second bit load (2044) and second bit-bar load (2050) are connected to a second Vdd node (2054). Source nodes of the second bit driver (2042) and second bit-bar driver (2048) are connected to a second Vss node (2056). The second bit-side data node (2046) is connected to a first source/drain node of a second bit-side passgate transistor (2058). A second source/drain node of the second bit-side passgate transistor (2058) is connected to a second bit line (2060). The second bit line (2060) is connected to source/drain nodes of bit-side passgate transistors in other SRAM cells (not shown) in a same column as the second SRAM cell (2004). A gate node of the second bit-side passgate transistor (2058) is connected to the first word line (2026). Similarly, the second bit-bar-side data node (2052) is connected to a first source/drain node of a second bit-bar-side passgate transistor (2062). A second source/drain node of the second bit-bar-side passgate transistor (2062) is connected to a second bit-bar line (2064). The second bit-bar line (2064) is connected to source/drain nodes of bit-bar-side passgate transistors in other SRAM cells (not shown) in a same column as the second SRAM cell (2004). A gate node of the second bit-bar-side passgate transistor (2062) is connected to the second word line (2032).

The second SRAM cell (2004) also includes an NMOS second bit-side auxiliary driver transistor (2066). A drain node of the second bit-side auxiliary driver transistor (2066) is connected to the second bit-side data node (2046). A gate node of the second bit-side auxiliary driver transistor (2066) is connected to the second bit-bar-side data node (2052). A source node (2068) of the second bit-side auxiliary driver transistor (2066) is connected to other source nodes of bit-side auxiliary driver transistors in other SRAM cells (not shown) in a same column as the second SRAM cell (2004). Similarly, the second SRAM cell (2004) also includes an NMOS second bit-bar-side auxiliary driver transistor (2070). A drain node of the second bit-bar-side auxiliary driver transistor (2070) is connected to the second bit-bar-side data node (2052). A gate node of the second bit-bar-side auxiliary driver transistor (2070) is connected to the second bit-side data node (2046). A source node (2072) of the second bit-bar-side auxiliary driver transistor (2070) is connected to other source nodes of bit-bar-side auxiliary driver transistors in other SRAM cells (not shown) in a same column as the second SRAM cell (2004).

In one embodiment, the auxiliary driver transistors (2034, 2038, 2066, 2070) may have an average threshold voltage magnitude at least 50 millivolts lower than the driver transistors (2006, 2012, 2042, 2048), possibly increasing static noise margin in half-addressed SRAM cells during write and read operations.

In an alternate embodiment, the driver transistors (2006, 2012, 2042, 2048), the load transistors (2008, 2014, 2044, 2050) and the auxiliary driver transistors (2034, 2038, 2066, 2070) may be finFET transistors. Forming the SRAM array (2000) with finFET transistors may reduce a size of the SRAM array (2000) and may reduce manufacturing costs per SRAM array.

In another embodiment, the driver transistors (2006, 2012, 2042, 2048), the load transistors (2008, 2014, 2044, 2050) and the auxiliary driver transistors (2034, 2038, 2066, 2070) may be CNTs. Forming the SRAM array (2000) with CNTs may reduce a size of the SRAM array (2000) and may reduce manufacturing costs per SRAM array. Forming the driver transistors (2006, 2012, 2042, 2048), the load transistors (2008, 2014, 2044, 2050) and the auxiliary driver transistors (2034, 2038, 2066, 2070) of CNTs may improve the threshold and on-state current uniformity of the driver transistors, load transistors, and auxiliary driver transistors, respectively, thereby possibly improving static noise margin values of the SRAM cells (2002, 2004).

FIG. 3A through FIG. 3E are flowcharts of a single sided write bit-side low operation, a single sided write bit-side high operation, a read bit-side operation, a transition to standby mode and a transition to sleep mode, respectively. The flowcharts in FIG. 3A through FIG. 3E refer to an SRAM array as depicted in FIG. 2. In a single sided write bit-side low operation, a low voltage is transferred from a bit line of an addressed SRAM cell through a bit-side passgate transistor so that a voltage substantially equal to Vss is stabilized on a bit-side data node. In a single sided write bit-side high operation, a high voltage is transferred from a bit line of an addressed SRAM cell through a bit-side passgate transistor so that a voltage substantially equal to Vdd is stabilized on a bit-side data node. In a read bit-side operation, a voltage on a bit-side data node of an addressed SRAM cell is transferred through a bit-side passgate transistor to a bit line. In a standby mode, no write or read operations are performed, while bias levels to a source node of driver and load transistors in SRAM cells are maintained at substantially the same levels as applied during write and read operations, to enable rapid transition from standby mode to write or read operations. In a sleep mode, no write or read operations are performed, while voltage levels across the driver and load transistors in SRAM cells are lowered to reduce power consumption of the SRAM array.

Figure 3A:
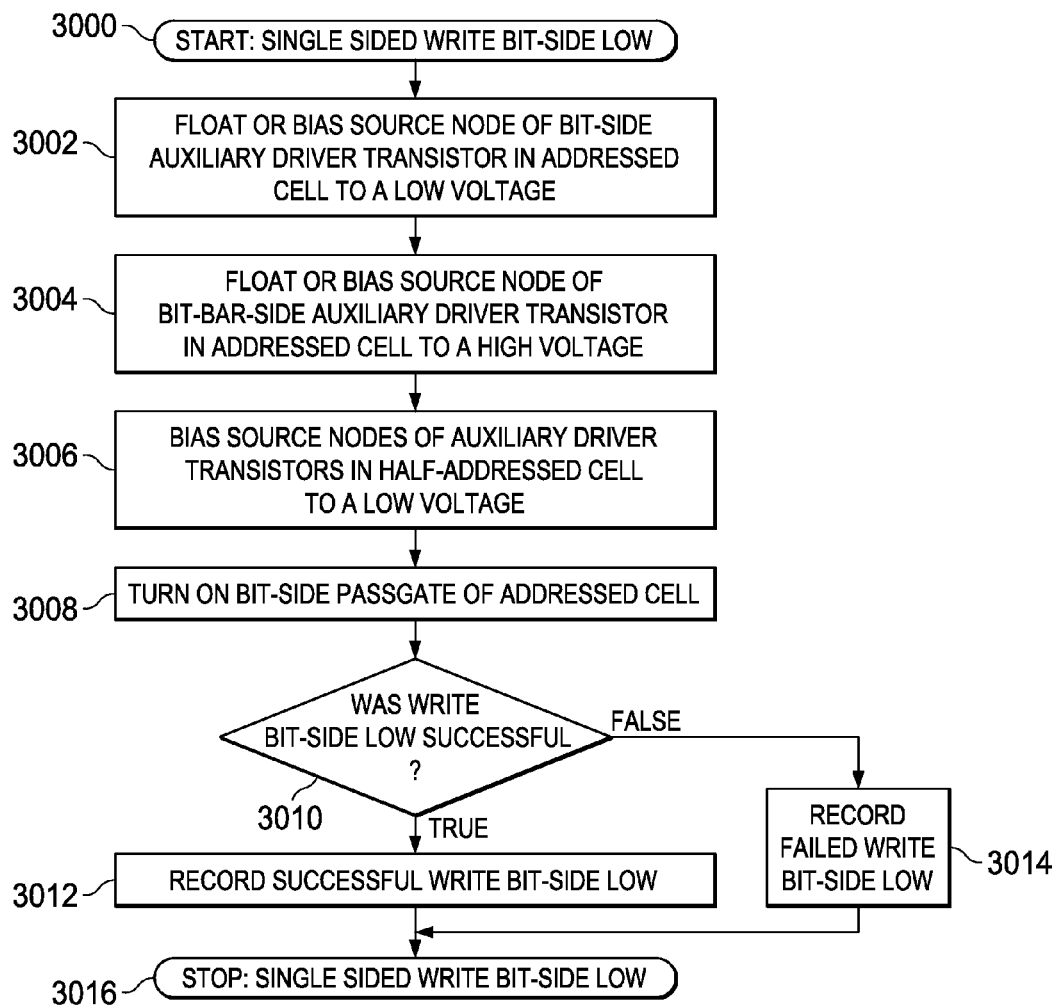
FIG. 3A through FIG. 3E are flowcharts of a single sided write bit-side low operation, a single sided write bit-side high operation, a read bit-side operation, a transition to standby mode and a transition to sleep mode, respectively.

Referring to FIG. 3A, the single sided write bit-side low operation begins (3000) with step (3002) which is to float a source node of a bit-side auxiliary driver transistor in an addressed SRAM cell or bias the source node of a bit-side auxiliary driver transistor in an addressed SRAM cell to a low voltage. Therefore, in one embodiment, the source node of the bit-side auxiliary driver transistor in the addressed SRAM cell may be floated. In an alternate embodiment, the source node of the bit-side auxiliary driver transistor in the addressed SRAM cell may be biased to a voltage below Vdd minus Vtn. In yet another embodiment, the source node of the bit-side auxiliary driver transistor in the addressed SRAM cell may be biased to a voltage below Vss plus Vtn. In a further embodiment, the source node of the bit-side auxiliary driver transistor in the addressed SRAM cell may be biased to a voltage below Vss. In an additional embodiment, the source node of the bit-side auxiliary driver transistor in the addressed SRAM cell may be biased to a voltage substantially equal to a voltage on a source node of driver transistors in the addressed SRAM cell.

Step (3004) is executed, which is to float a source node of a bit-bar-side auxiliary driver transistor in the addressed SRAM cell or bias the source node of a bit-bar-side auxiliary driver transistor in the addressed SRAM cell to a high voltage. Therefore, in one embodiment, the source node of the bit-bar-side auxiliary driver transistor in the addressed SRAM cell may be floated. In an alternate embodiment, the source node of the bit-bar-side auxiliary driver transistor in the addressed SRAM cell may be biased to a voltage above Vss plus Vtn. In yet another embodiment, the source node of the bit-bar-side auxiliary driver transistor in the addressed SRAM cell may be biased to a voltage above Vdd minus Vtn. In a further embodiment, the source node of the bit-bar-side auxiliary driver transistor in the addressed SRAM cell may be biased to a voltage above Vdd. In an additional embodiment, the source node of the bit-bar-side auxiliary driver transistor in the addressed SRAM cell may be biased to a voltage substantially equal to a voltage on a source node of load transistors in the addressed SRAM cell.

Step (3006) is executed, which is to bias source nodes of auxiliary driver transistors in a half-addressed SRAM cell to a low voltage. In one embodiment, the source nodes of the auxiliary driver transistors in the half-addressed SRAM cell may be biased to a voltage below Vdd minus Vtn. In an alternate embodiment, the source nodes of the auxiliary driver transistors in the half-addressed SRAM cell may be biased to a voltage below Vss plus Vtn. In another embodiment, the source nodes of the auxiliary driver transistors in the half-addressed SRAM cell may be biased to a voltage below Vss. In a further embodiment, the source nodes of the auxiliary driver transistors in the half-addressed SRAM cell may be biased to a voltage substantially equal to a voltage on a source node of driver transistors in the half-addressed SRAM cell.

Step (3008) is executed, which is to turn on a bit-side passgate transistor in the addressed SRAM cell. In embodiments of the single sided write bit-side low operation which are part of test operations, following execution of step (3008), step (3010) is executed, which is to determine if a low voltage was successfully transferred to a bit-side data node and to determine if there was a data upset in the half-addressed SRAM cell. If the low voltage was successfully transferred to the bit-side data node and there was no data upset in the half-addressed SRAM cell, step (3012) is executed, which is to record a successful single sided write bit-side low operation for the addressed SRAM cell. If the low voltage was not successfully transferred to the bit-side data node or there was a data upset in the half-addressed SRAM cell, step (3014) is executed, which is to record a failed single sided write bit-side low operation for the addressed SRAM cell. After step (3012) or step (3014) is executed, or after step (3008) is executed in embodiments which are not part of test operations, the single sided write bit-side low operation is ended (3016). In other embodiments of the single sided write bit-side low operation, steps (3002), (3004) and (3006) may be performed in any order.

Figure 3B:
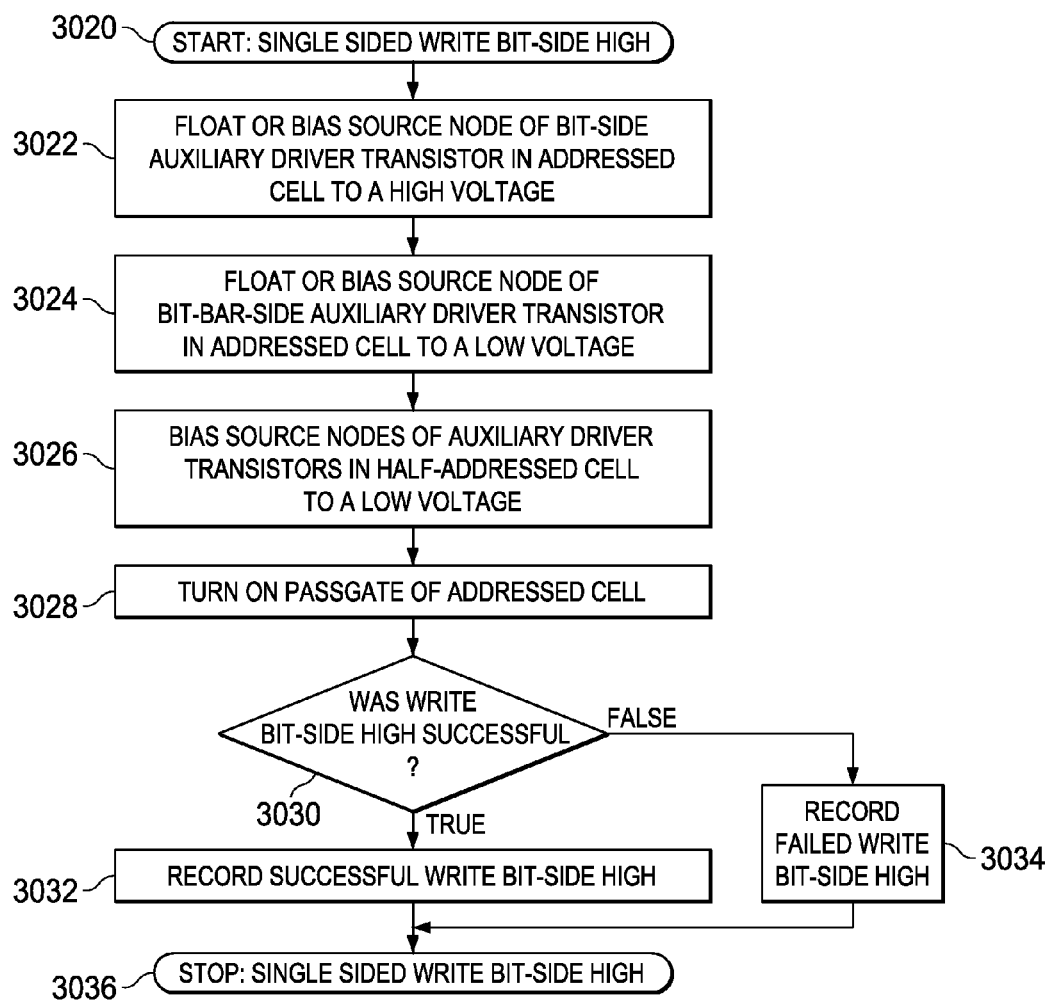

Referring to FIG. 3B, the single sided write bit-side high operation begins (3020) with step (3022) which is to float a source node of a bit-side auxiliary driver transistor in an addressed SRAM cell or bias the source node of a bit-side auxiliary driver transistor in an addressed SRAM cell to a high voltage. Therefore, in one embodiment, the source node of the bit-side auxiliary driver transistor in the addressed SRAM cell may be floated. In an alternate embodiment, the source node of the bit-side auxiliary driver transistor in the addressed SRAM cell may be biased to a voltage above Vss plus Vtn. In yet another embodiment, the source node of the bit-side auxiliary driver transistor in the addressed SRAM cell may be biased to a voltage above Vdd minus Vtn. In a further embodiment, the source node of the bit-side auxiliary driver transistor in the addressed SRAM cell may be biased to a voltage above Vdd. In an additional embodiment, the source node of the bit-side auxiliary driver transistor in the addressed SRAM cell may be biased to a voltage substantially equal to a voltage on a source node of load transistors in the addressed SRAM cell.

Step (3024) is executed, which is to float a source node of a bit-bar-side auxiliary driver transistor in the addressed SRAM cell or bias the source node of a bit-bar-side auxiliary driver transistor in the addressed SRAM cell to a low voltage. Therefore, in one embodiment, the source node of the bit-bar-side auxiliary driver transistor in the addressed SRAM cell may be floated. In an alternate embodiment, the source node of the bit-bar-side auxiliary driver transistor in the addressed SRAM cell may be biased to a voltage below Vdd minus Vtn. In yet another embodiment, the source node of the bit-bar-side auxiliary driver transistor in the addressed SRAM cell may be biased to a voltage below Vss plus Vtn. In a further embodiment, the source node of the bit-bar-side auxiliary driver transistor in the addressed SRAM cell may be biased to a voltage below Vss. In an additional embodiment, the source node of the bit-bar-side auxiliary driver transistor in the addressed SRAM cell may be biased to a voltage substantially equal to a voltage on a source node of driver transistors in the addressed SRAM cell.

Step (3026) is executed, which is to bias source nodes of auxiliary driver transistors in a half-addressed SRAM cell to a low voltage. In one embodiment, the source nodes of the auxiliary driver transistors in the half-addressed SRAM cell may be biased to a voltage below Vdd minus Vtn. In an alternate embodiment, the source nodes of the auxiliary driver transistors in the half-addressed SRAM cell may be biased to a voltage below Vss plus Vtn. In another embodiment, the source node of the auxiliary driver transistors in the half-addressed SRAM cell may be biased to a voltage below Vss. In a further embodiment, the source nodes of the auxiliary driver transistors in the half-addressed SRAM cell may be biased to a voltage substantially equal to a voltage on a source node of driver transistors in the half-addressed SRAM cell.

Step (3028) is executed, which is to turn on a bit-side passgate transistor in the addressed SRAM cell. In embodiments of the single sided write bit-side high operation which are part of test operations, following execution of step (3028), step (3030) is executed, which is to determine if a voltage substantially equal to Vdd, hereafter referred to as a high voltage, was successfully transferred to a bit-side data node and to determine if there was a data upset in the half-addressed SRAM cell. If the high voltage was successfully transferred to the bit-side data node and there was no data upset in the half-addressed SRAM cell, step (3032) is executed, which is to record a successful single sided write bit-side high operation for the addressed SRAM cell. If the high voltage was not successfully transferred to the bit-side data node or there was a data upset in the half-addressed SRAM cell, step (3034) is executed, which is to record a failed single sided write bit-side high operation for the addressed SRAM cell. After step (3032) or step (3034) is executed, or after step (3028) is executed in embodiments which are not part of test operations, the single sided write bit-side high operation is ended (3036). In other embodiments of the single sided write bit-side high operation, steps (3022), (3024) and (3026) may be performed in any order.

Figure 3C:
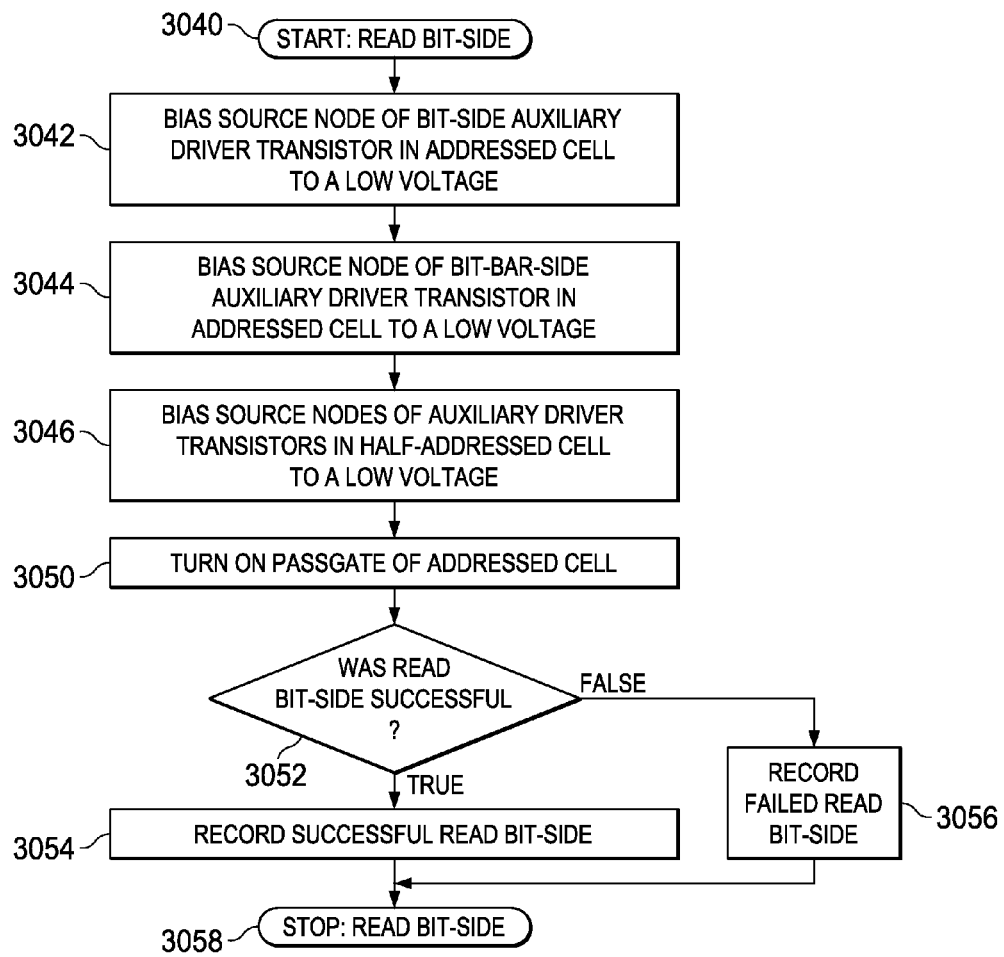

Referring to FIG. 3C, the read bit-side operation begins (3040) with step (3042) which is to bias a source node of a bit-side auxiliary driver transistor in an addressed SRAM cell to a low voltage. In one embodiment, the source node of the bit-side auxiliary driver transistor in the addressed SRAM cell may be biased to a voltage below Vss plus Vtn. In an alternate embodiment, the source node of the bit-side auxiliary driver transistor in the addressed SRAM cell may be biased to a voltage below Vdd minus Vtn. In another embodiment, the source node of the bit-side auxiliary driver transistor in the addressed SRAM cell may be biased to a voltage below Vss. In an additional embodiment, the source node of the bit-side auxiliary driver transistor in the addressed SRAM cell may be biased to a voltage substantially equal to a voltage on a source node of driver transistors in the addressed SRAM cell.

Step (3044) is executed, which is to bias a source node of a bit-bar-side auxiliary driver transistor in the addressed SRAM cell to a low voltage. In one embodiment, the source node of the bit-bar-side auxiliary driver transistor in the addressed SRAM cell may be biased to a voltage below Vdd minus Vtn. In an alternate embodiment, the source node of the bit-bar-side auxiliary driver transistor in the addressed SRAM cell may be biased to a voltage below Vss plus Vtn. In another embodiment, the source node of the bit-bar-side auxiliary driver transistor in the addressed SRAM cell may be biased to a voltage below Vss. In an additional embodiment, the source node of the bit-bar-side auxiliary driver transistor in the addressed SRAM cell may be biased to a voltage substantially equal to a voltage on a source node of driver transistors in the addressed SRAM cell.

Step (3046) is executed, which is to bias source nodes of auxiliary driver transistors in a half-addressed SRAM cell to a low voltage. In one embodiment, the source nodes of the auxiliary driver transistors in the half-addressed SRAM cell may be biased to a voltage below Vdd minus Vtn. In an alternate embodiment, the source nodes of the auxiliary driver transistors in the half-addressed SRAM cell may be biased to a voltage below Vss plus Vtn. In another embodiment, the source node of the auxiliary driver transistors in the half-addressed SRAM cell may be biased to a voltage below Vss. In a further embodiment, the source nodes of the auxiliary driver transistors in the half-addressed SRAM cell may be biased to a voltage substantially equal to a voltage on a source node of driver transistors in the half-addressed SRAM cell.

Step (3050) is executed, which is to turn on a bit-side passgate transistor in the addressed SRAM cell. In embodiments of the read bit-side operation which are part of test operations, following execution of step (3050), step (3052) is executed, which is to determine if a voltage on the bit-side data node was successfully transferred to a bit data line of the addressed SRAM cell and to determine if there was a data upset in the half-addressed SRAM cell. If the voltage on the bit-side data node was successfully transferred to the bit data line of the addressed SRAM cell and there was no data upset in the half-addressed SRAM cell, step (3054) is executed, which is to record a successful read bit-side operation for the addressed SRAM cell. If the voltage on the bit-side data node was not successfully transferred to the bit data line or there was a data upset in the half-addressed SRAM cell, step (3056)

is executed, which is to record a failed read bit-side operation for the addressed SRAM cell. After step (3054) or step (3056) is executed, or after step (3050) is executed in embodiments which are not part of test operations, the read bit-side operation is ended (3058). In other embodiments of the read bit-side operation, steps (3042), (3044) and (3046) may be performed in any order.

Figure 3D:
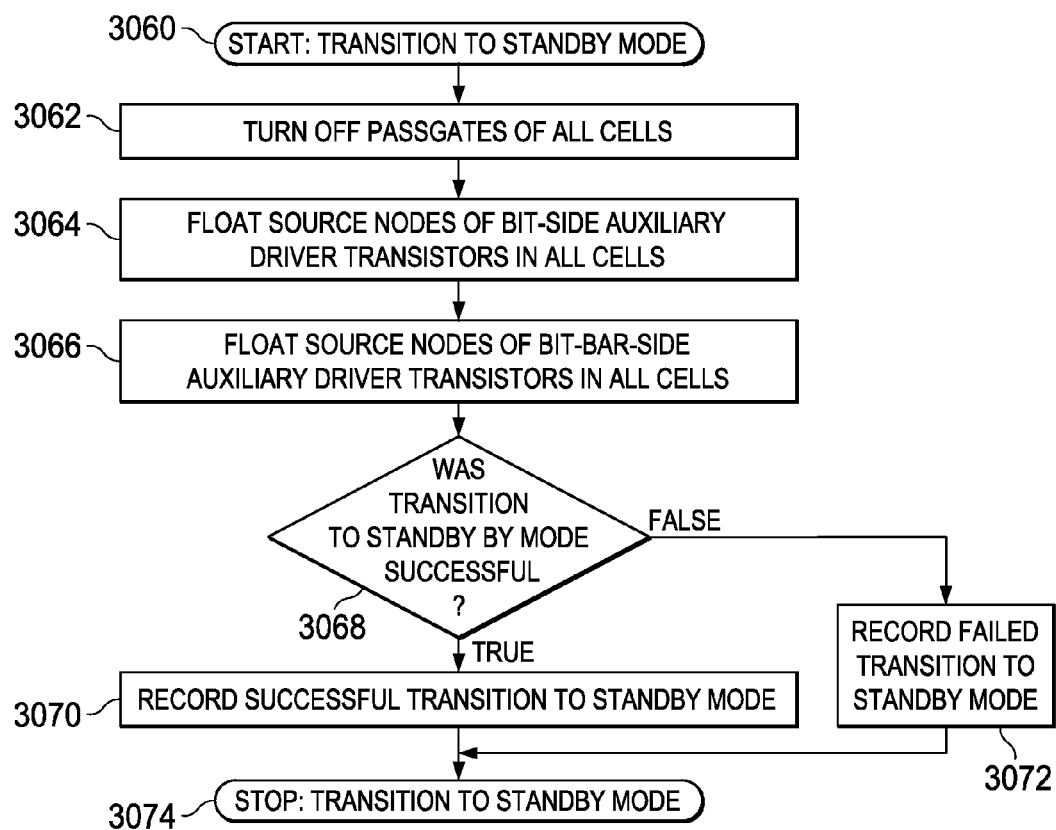

Referring to FIG. 3D, the transition to standby mode operation begins (3060) with step (3062) which is to turn off passgates of SRAM cells, including SRAM cell which were addressed SRAM cells and half-addressed SRAM cells during the single sided write bit-side low operation, the single sided write bit-side high operation, and the read bit-side operation described in reference to FIG. 3A through FIG. 3C. Step (3064) is executed, which is to float the source nodes of bit-side auxiliary driver transistors in SRAM cells. Step (3066) is executed, which is to float the source nodes of bit-bar-side auxiliary driver transistors in SRAM cells. In embodiments of the transition to standby mode operation which are part of test operations (such as measurements of leakage currents in SRAM cell arrays), following execution of step (3066), step (3068) is executed, which is to determine if the transition to standby mode was successful (for example if leakage currents were below target values). If the transition to standby mode was successful, step (3070) is executed, which is to record a successful transition to standby mode operation for the SRAM cell array. If the transition to standby mode was not successful, step (3072) is executed, which is to record a failed transition to standby mode operation for the SRAM cell array. After step (3070) or step (3072) is executed, or after step (3066) is executed in embodiments which are not part of test operations, the transition to standby mode operation is ended (3074). In other embodiments of the transition to standby mode operation, steps (3064) and (3066) may be performed in any order.

Figure 3E:
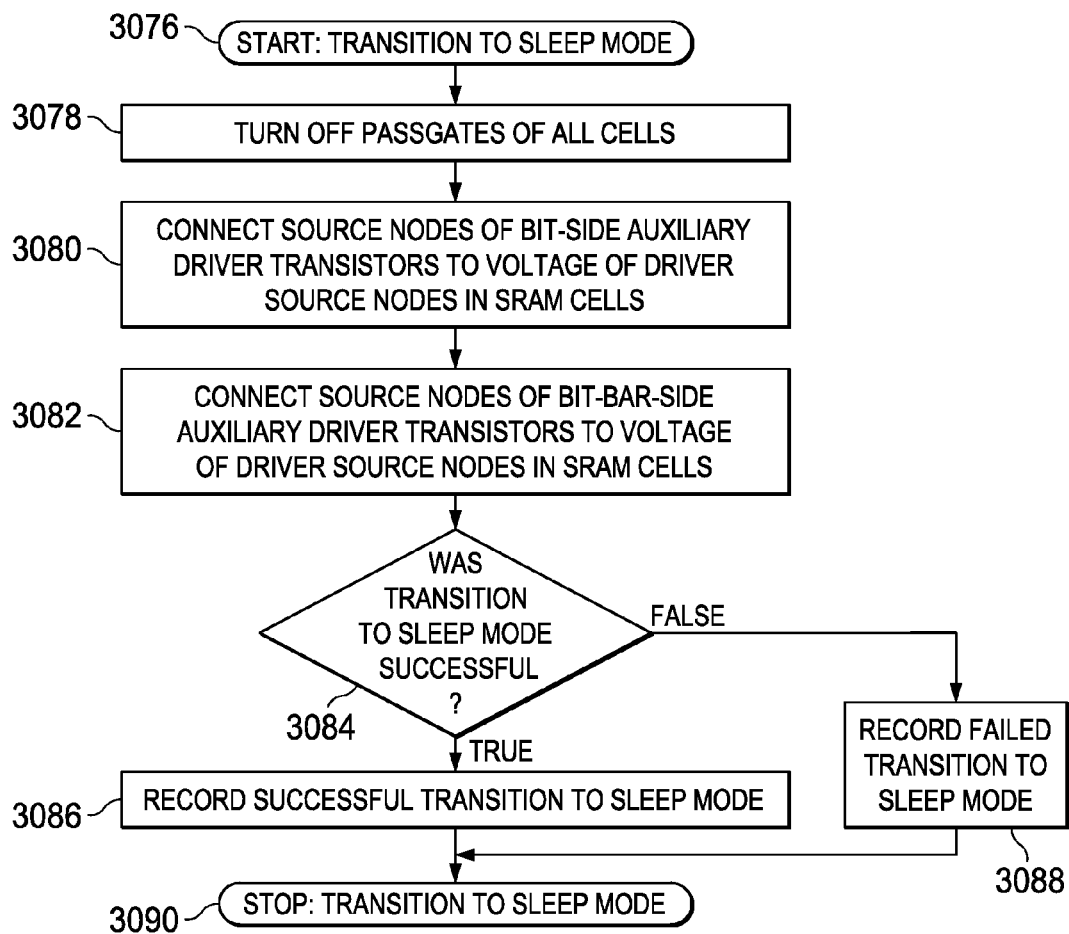

Referring to FIG. 3E, the transition to sleep mode operation begins (3076) with step (3078) which is to turn off passgates of SRAM cells, including SRAM cell which were addressed SRAM cells and half-addressed SRAM cells during the single sided write bit-side low operation, the single sided write bit-side high operation, and the read bit-side operation described in reference to FIG. 3A through FIG. 3C. Step (3080) is executed, which is to connect the source nodes of bit-side auxiliary driver transistors in SRAM cells to a voltage substantially equal to a voltage of a source node of driver transistors in the SRAM cells. This step may be repeated if the voltage of the source nodes of the driver transistors in the SRAM cells is changed in increments during the transition to sleep mode operation. Step (3082) is executed, which is to connect the source nodes of bit-bar-side auxiliary driver transistors in SRAM cells to a voltage substantially equal to a voltage of a source node of driver transistors in the SRAM cells. This step may be repeated if the voltage of the source nodes of the driver transistors in the SRAM cells is adjusted (during the transition to sleep mode operation). In embodiments of the transition to sleep mode operation which are part of test operations, such as measurements of power consumption in SRAM cell arrays, following execution of step (3082), step (3084) is executed, which is to determine if the transition to sleep mode was successful (for example if power consumption was below target values). If the transition to sleep mode was successful, step (3086) is executed, which is to record a successful transition to sleep mode operation for the SRAM cell array. If the transition to standby mode was not successful, step (3088) is executed, which is to record a failed transition to standby mode operation for the SRAM cell array. After step (3086) or step (3088) is executed, or after step (3082) is executed in embodiments which are not part of test operations, the transition to standby mode operation is ended (3090). In other embodiments of the transition to standby mode operation, steps (3080) and (3082) may be performed in any order.

It will be recognized by those familiar with SRAM design and operation that a single sided write bit-bar-side low operation may be performed on an SRAM array as depicted in FIG. 2, using the single sided write bit-side low operation steps (as recited supra in reference to FIG. 3A) with appropriate exchanges between bit-side and bit-bar-side transistors. Similarly, it will be recognized that a single sided write bit-bar-side high operation may be performed on an SRAM array as depicted in FIG. 2, using the single sided write bit-side high operation steps (as recited supra in reference to FIG. 3B) with appropriate exchanges between bit-side and bit-bar-side transistors. Furthermore, it will be recognized that a read bit-bar-side operation may be performed on an SRAM array as depicted in FIG. 2, using the read bit-side operation steps (as recited supra in reference to FIG. 3C) with appropriate exchanges between bit-side and bit-bar-side transistors.

Figure 4:
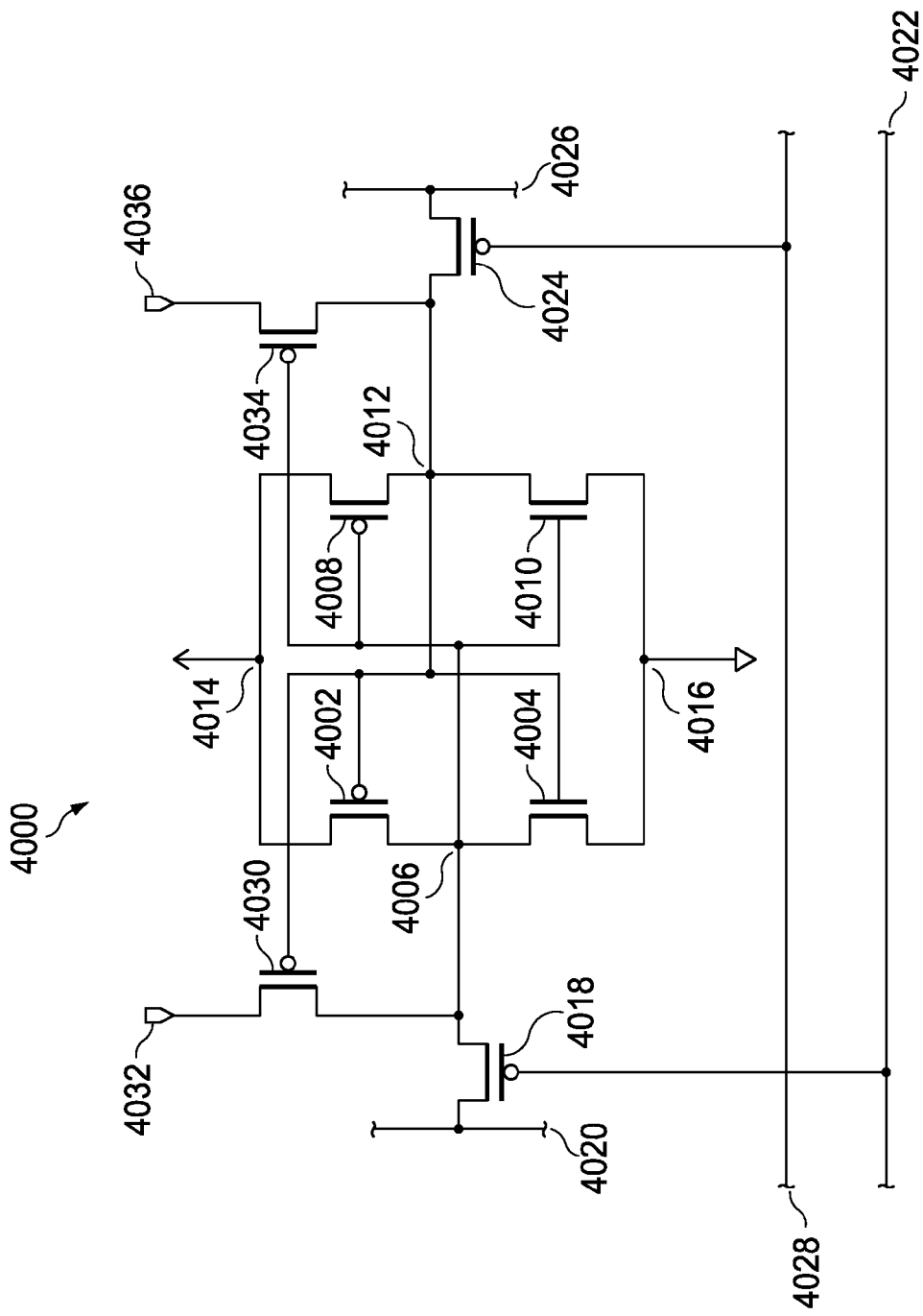
FIG. 4 is a circuit diagram of an SRAM cell containing PMOS auxiliary driver transistors.

Moreover, it will be recognized by those familiar with SRAM design and fabrication that the embodiments described in reference to FIG. 2 and FIG. 3A through FIG. 3E may be attained in integrated circuits containing arrays of SRAM cells with PMOS driver transistors, NMOS load transistors, and PMOS auxiliary driver transistors. For example, FIG. 4 is a circuit diagram of an SRAM cell (4000) in an SRAM cell array contained in an integrated circuit. The SRAM cell (4000) contains PMOS auxiliary driver transistors. The SRAM cell (4000) includes a PMOS bit driver (4002) and an NMOS bit load (4004). A drain node of the bit driver (4002) and a drain node of the bit load (4004) are connected to a bit-side data node (4006). The SRAM cell (4000) also includes a PMOS bit-bar driver (4008) and an NMOS bit-bar load transistor (4010). A drain node of the bit-bar driver (4008) and a drain node of the bit-bar load (4010) are connected to a bit-bar-side data node (4012). A source node of the bit driver (4002) and a source node of the bit-bar driver (4008) are connected to a Vdd node (4014). A source node of the bit load (4004) and a source node of the bit-bar load (4010) are connected to a Vss node (4016). A gate node of the bit driver (4002) and a gate node of the bit load (4004) are connected to the bit-bar-side data node (4012). Similarly, a gate node of the bit-bar driver (4008) and a gate node of the bit-bar load (4010) are connected to the bit-side data node (4006).

The SRAM cell (4000) further includes a bit-side passgate transistor (4018). A first source/drain node of the bit-side passgate transistor (4018) is connected to the bit-side data node (4006). A second source/drain node of the bit-side passgate transistor (4018) is connected to a bit line (4020). The bit line (4020) is connected to source/drain nodes of bit-side passgate transistors in other SRAM cells (not shown) in a same column as the SRAM cell (4000). A gate node of the bit-side passgate transistor (4018) is connected to a first word line (4022).

In addition, the SRAM cell (4000) includes a bit-bar-side passgate transistor (4024). A first source/drain node of the bit-bar-side passgate transistor (4024) is connected to the bit-bar-side data node (4012). A second source/drain node of the bit-bar-side passgate transistor (4024) is connected to a bit-bar line (4026). The bit-bar line (4026) is connected to source/drain nodes of bit-bar-side passgate transistors in other SRAM cells (not shown) in a same column as the SRAM cell (4000). A gate node of the bit-bar-side passgate transistor (4024) is connected to a second word line (4028).

The SRAM cell (4000) further includes a PMOS bit-side auxiliary driver transistor (4030). A drain node of the bit-side auxiliary driver transistor (4030) is connected to the bit-side data node (4006). A gate node of the bit-side auxiliary driver transistor (4030) is connected to the bit-bar-side data node (4012). A source node (4032) of the bit-side auxiliary driver transistor (4030) is connected to other source nodes of bit-side auxiliary driver transistors in other SRAM cells (not shown) in a same column as the SRAM cell (4000). Similarly, the SRAM cell (4000) also includes a PMOS bit-bar-side auxiliary driver transistor (4034). A drain node of the bit-bar-side auxiliary driver transistor (4034) is connected to the bit-bar-side data node (4012). A gate node of the bit-bar-side auxiliary driver transistor (4034) is connected to the bit-side data node (4006). A source node (4036) of the bit-bar-side auxiliary driver transistor (4034) is connected to other source nodes of bit-bar-side auxiliary driver transistors in other SRAM cells (not shown) in a same column as the SRAM cell (4000).

In one embodiment, a sum of on-state currents of the bit driver (4002) and the bit-side auxiliary driver transistor (4030) is greater than an on-state current of the bit-side passgate transistor (4018). In addition, a sum of on-state currents of the bit-bar driver (4008) and the bit-bar-side auxiliary driver transistor (4034) is greater than an on-state current of the bit-bar-side passgate transistor (4024). In a further embodiment, the driver transistors (4002, 4008) and the load transistors (4004, 4010) are a minimum width consistent with fabrication methods used to manufacture the SRAM array (4000). Minimizing driver and load transistor widths may reduce a size of the SRAM array and thereby possibly reduce manufacturing costs of the integrated circuit.

Write bit-side low, write bit-side high, read bit-side, transition to standby mode and transition to sleep mode operations may be performed on an SRAM cell array containing SRAM cells with PMOS auxiliary driver transistors as described in reference to FIG. 4, using the processes recited in reference to FIG. 3A through FIG. 3E, with appropriate changes in polarity of bias voltages. Similarly, write bit-bar-side low, write bit-bar-side high, and read bit-bar-side operations may be performed on an SRAM cell array containing SRAM cells with PMOS auxiliary driver transistors as described in reference to FIG. 4, with appropriate exchanges between bit-side and bit-bar-side transistors.

In one embodiment, the auxiliary driver transistors (4030, 4034) may have an average threshold voltage magnitude at least 50 millivolts lower than the driver transistors (4002, 4008), possibly increasing the static noise margin in half-addressed SRAM cells during write and read operations. In an alternate embodiment, the driver transistors (4002, 4008), the load transistors (4004, 4010) and the auxiliary driver transistors (4030, 4034) may be finFET transistors. Forming the SRAM cell (4000) with finFET transistors may reduce a size of the SRAM array and possibly reduce manufacturing costs per SRAM array.

In another embodiment, the driver transistors (4002, 4008), the load transistors (4004, 4010) and the auxiliary driver transistors (4030, 4034) may be CNTs. Forming the SRAM cell (4000) with CNTs may reduce a size of the SRAM array and possibly reduce manufacturing costs per SRAM array. Forming the driver transistors (4002, 4008), the load transistors (4004, 4010) and the auxiliary driver transistors (4030, 4034) of CNTs may improve threshold and on-state current uniformity of the driver transistors, load transistors, and auxiliary driver transistors, respectively, thereby possibly improving a static noise margin value of the SRAM cell (4000).

Figure 5:
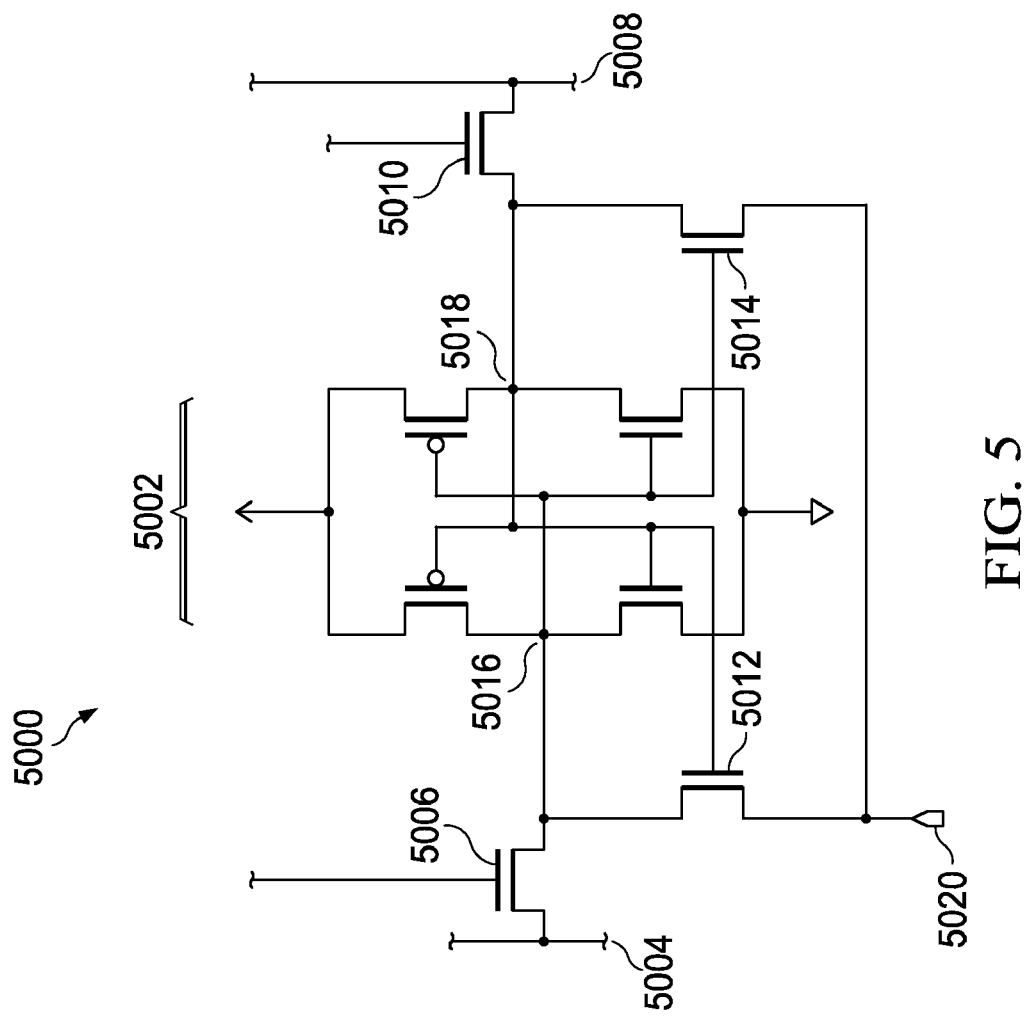
FIG. 5 depicts an SRAM cell with a source node of a bit-side auxiliary driver transistor and a source node of a bit-bar-side auxiliary driver transistor directly electrically connected in each SRAM cell.

In some embodiments, the source nodes of bit-side auxiliary driver transistors and the source nodes of bit-bar-side auxiliary driver transistors may be directly electrically connected in each SRAM cell. FIG. 5 depicts an SRAM cell (5000) containing NMOS drivers and PMOS loads forming a pair of cross-coupled inverters (5002), as described supra in reference to cells (2002) and (2004) of FIG. 2. A bit line (5004) is connected to a bit-side passgate transistor (5006), and a bit-bar line (5008) is connected to a bit-bar-side passgate transistor (5010) (as described supra in reference to FIG. 2).

The SRAM cell (5000) further includes an NMOS bit-side auxiliary driver transistor (5012) and an NMOS bit-bar-side auxiliary driver transistor (5014). Drain nodes of the bit-side auxiliary driver transistor (5012) and bit-bar-side auxiliary driver transistor (5014) are connected to a bit-side data node and a bit-bar-side data node, respectively, of the cross-coupled inverters (5002) (as described supra in reference to FIG. 2). However, a source node of the bit-side auxiliary driver transistor (5012) and a source node of the bit-bar-side auxiliary driver transistor (5014) are connected to a common auxiliary transistor source node (5016) contained in the SRAM cell (5000). The common auxiliary transistor source node (5016) is connected to other common auxiliary transistor source nodes in other SRAM cells in a same column as the SRAM cell (5000).

During write low, write high, read, transition to standby mode and transition to sleep mode operations (as described in some of the embodiments recited in reference to FIG. 3A through FIG. 3E), the source node of the bit-side auxiliary driver transistor (5012) and the source node of the bit-bar-side auxiliary driver transistor (5014) are biased together. Connecting source nodes of the bit-side auxiliary driver transistor (5012) and bit-bar-side auxiliary driver transistor (5014) within each cell may enable a reduction in SRAM cell size. In addition, connecting source nodes of the bit-side auxiliary driver transistor (5012) and bit-bar-side auxiliary driver transistor (5014) within each cell may enable a reduction in the complexity of a bias circuit for the auxiliary transistor source nodes.

It will be recognized by those familiar with SRAM design and fabrication that the embodiment of FIG. 5 may also be attained in integrated circuits containing arrays of SRAM cells with PMOS driver transistors, NMOS load transistors, and PMOS auxiliary driver transistors. Therefore, the write low, write high, read, transition to standby mode and transition to sleep mode operations are performed on an SRAM cell array containing SRAM cells with NMOS auxiliary driver transistors (as described in reference to FIG. 4) with source nodes of the auxiliary transistors connected to a common auxiliary transistor source node within the SRAM cell (as described in reference to FIG. 5) using the processes recited in reference to FIG. 3A through FIG. 3E, with appropriate changes in polarity of bias voltages.

Figure 6:
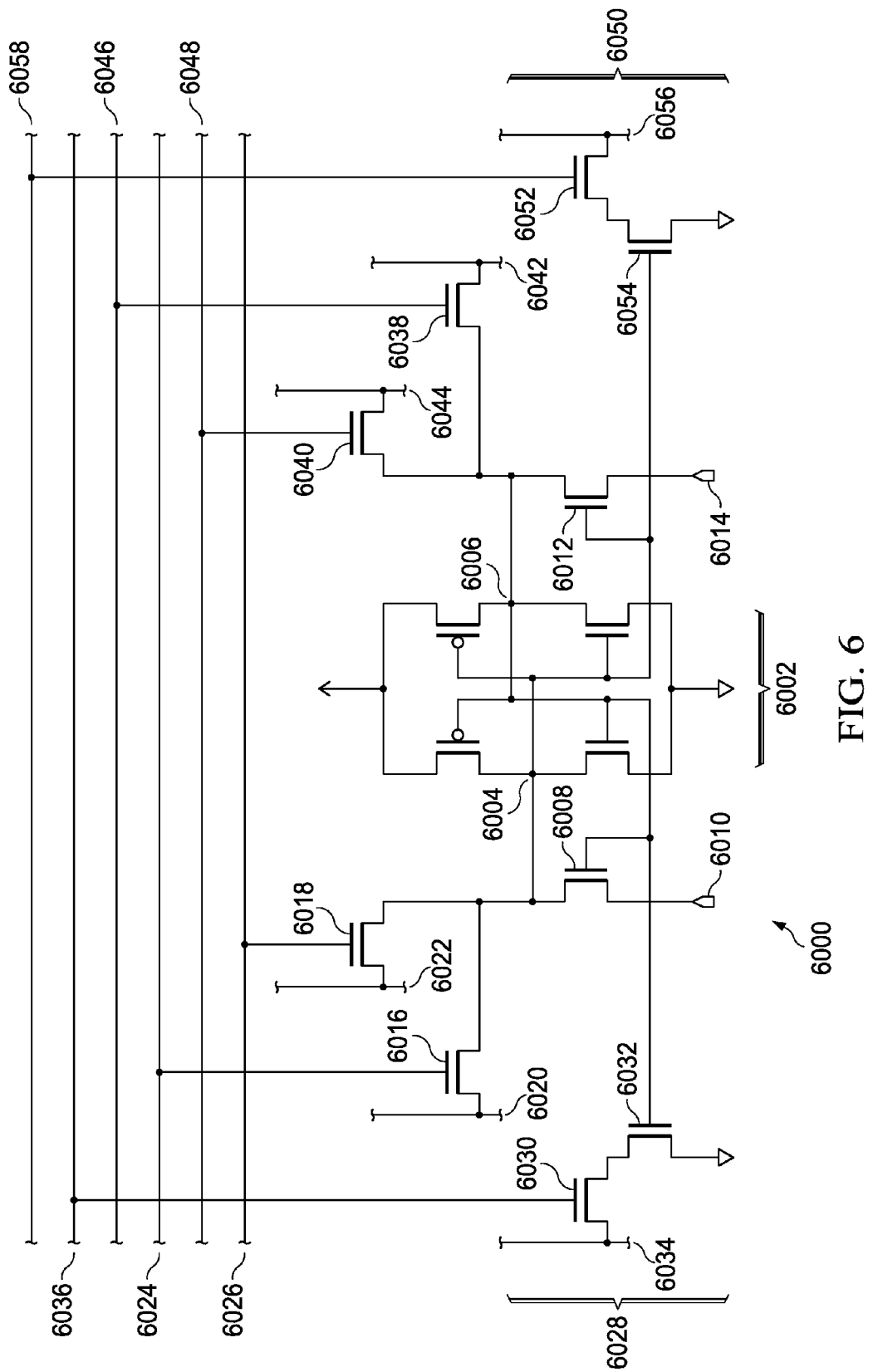
FIG. 6 depicts an SRAM cell which includes an additional optional single sided write port and an optional read buffer on each data node.

It is within the scope of the instant invention for an SRAM cell as described in reference to FIG. 2, FIG. 4 or FIG. 5 to include additional single sided write ports or read buffers. For example, FIG. 6 depicts an SRAM cell (6000) which includes an additional optional single sided write port and an optional read buffer on each data node. The SRAM cell (6000) includes a pair of cross-coupled inverters (6002) (as described in reference to SRAM cells (2002) and (2004) of FIG. 2). The cross-coupled inverters (6002) include a bit-side data node (6004) and a bit-bar-side data node (6006). The bit-side data node (6004) is connected to a drain node of a bit-side auxiliary driver transistor (6008). A gate node of the bit-side auxiliary driver transistor (6008) is connected to the bit-bar-side data node (6006). A source node (6010) of the bit-side auxiliary driver transistor (6008) is connected to an auxiliary driver transistor bias circuit (shown in FIG. 1). Similarly, the bit-bar-side data node (6006) is connected to a drain node of a bit-bar-side auxiliary driver transistor (6012). A gate node of the bit-bar-side auxiliary driver transistor (6012) is connected to the bit-side data node (6004). A source node (6014) of the bit-bar-side auxiliary driver transistor (6012) is connected to the auxiliary driver transistor bias circuit.

The bit-side data node (6004) is connected to a first bit-side passgate transistor (6016) and an optional second bit-side passgate transistor (6018), as described in reference to FIG. 2. The first bit-side passgate transistor (6016) is connected to a first bit line (6020) and the second bit-side passgate transistor (6018), if present, is connected to a second bit line (6022), as described in reference to FIG. 2. Gate nodes of the first bit-side passgate transistor (6016) and the second bit-side passgate transistor (6018) are connected to a first word line (6024) and a second word line (6026), respectively (as described in reference to FIG. 2). An optional bit-side read buffer (6028), which includes a bit-side access transistor (6030) and a bit-side read buffer driver transistor (6032), is connected to the bit-bar-side data node (6006). A gate node of the bit-side read buffer driver transistor (6032) is connected to the bit-bar-side data node (6006). A source/drain node of the bit-side access transistor (6030) is connected to a third bit line (6034). A gate node of the bit-side access transistor (6030) is connected to a third word line (6036).

Similarly, the bit-bar-side data node (6006) is connected to a first bit-bar-side passgate transistor (6038) and an optional second bit-bar-side passgate transistor (6040). The first bit-bar-side passgate transistor (6038) is connected to a first bit-bar line (6042) and the second bit-bar-side passgate transistor (6040), if present, is connected to a second bit-bar line (6044). Gate nodes of the first bit-bar-side passgate transistor (6038) and the second bit-bar-side passgate transistor (6040) are connected to a fourth word line (6046) and a fifth word line (6048), respectively. An optional bit-bar-side read buffer (6050), which includes a bit-bar-side access transistor (6052) and a bit-bar-side read buffer driver transistor (6054), is connected to the bit-side data node (6004). A gate node of the bit-bar-side read buffer driver transistor (6054) is connected to the bit-side data node (6004). A source/drain node of the bit-bar-side access transistor (6052) is connected to a sixth bit-bar line (6056). A gate node of the bit-bar-side access transistor (6052) is connected to a sixth word line (6058).

During the operation of the SRAM cell (6000), the single sided write operations may transfer data to the bit-side data node (6004) independently through a first bit-side passgate transistor (6016) and an optional second bit-side passgate transistor (6018). The single sided write operations may also transfer data to the bit-bar-side data node (6006) independently through the first bit-bar-side passgate transistor (6038) and an optional second bit-bar-side passgate transistor (6040). Furthermore, data may be read from the bit-side data node (6004) through the bit-side read buffer and from the bit-bar-side data node (6006) through the bit-bar-side read buffer during single sided read operations. Using the bit-side auxiliary driver transistor (6008) and the bit-bar-side auxiliary driver transistor (6012) in the SRAM cell (6000) may enable more than one single sided write operation on each of the data nodes (6004, 6006). In addition, using the read buffers in the SRAM cell (6000) may enable read operations to be performed concurrently with write operations (commonly known as 'write-through operations').

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit, comprising:
an array of SRAM cells, said SRAM cells being arranged in rows and columns, each said SRAM cell further including:
a bit-side driver transistor, said bit-side driver transistor further including a gate node, a source node and a drain node;
a bit-side data node, wherein said bit-side data node is connected to said drain node of said bit-side driver transistor;
a bit-side load transistor, said bit-side load transistor further including a gate node, a source node and a drain node, wherein said drain node of said bit-side load transistor is connected to said bit-side data node;
a bit-bar-side driver transistor, said bit-bar-side driver transistor further including a gate node, a source node and a drain node, wherein said gate node of said bit-bar-side driver transistor is connected to said bit-side data node;
a bit-bar-side data node, wherein said bit-bar-side data node is connected to said drain node of said bit-bar-side driver transistor, to said gate node of said bit-side driver transistor and to said gate node of said bit-side load transistor;
a bit-bar-side load transistor, said bit-bar-side load transistor further including a gate node, a source node and a drain node, wherein said drain node of said bit-bar-side load transistor is connected to said bit-bar-side data node, and said gate node of said bit-bar-side load transistor is connected to said bit-side data node;
a bit-side auxiliary driver transistor, said bit-side auxiliary driver transistor further including a gate node, a source node and a drain node, wherein said drain node of said bit-side auxiliary driver transistor is connected to said bit-side data node, and said gate node of said bit-side auxiliary driver transistor is connected to said bit-bar-side data node;
a bit-bar-side auxiliary driver transistor, said bit-bar-side auxiliary driver transistor further including a gate node, a source node and a drain node, wherein said drain node of said bit-bar-side auxiliary driver transistor is connected to said bit-bar-side data node, and said gate node of said bit-bar-side auxiliary driver transistor is connected to said bit-side data node;
a bit-side passgate transistor, said bit-side passgate transistor further including a gate node, a first source/drain node and a second source/drain node, wherein said first source/drain node of said bit-side passgate transistor is connected to said bit-side data node, said second source/drain node of said bit-side passgate transistor is connected to a bit line, and said gate node of said bit-side passgate transistor is connected to a first word line; and
a bit-bar-side passgate transistor, said bit-bar-side passgate transistor further including a gate node, a first source/drain node and a second source/drain node, wherein said first source/drain node of said bit-bar-side passgate transistor is connected to said bit-bar-side data node, said second source/drain node of said bit-bar-side passgate transistor is connected to a bit-bar line, and said gate node of said bit-bar-side passgate transistor is connected to a second word line; and an auxiliary driver transistor bias circuit coupled to said array of SRAM cells, said auxiliary driver transistor bias circuit being configured to provide bias voltages to said source node of said bit-side auxiliary driver transistor and said source node of said bit-bar-side auxiliary driver transistor.

2. The integrated circuit of claim 1, in which said auxiliary driver transistor bias circuit is configured to provide a first set of bias voltages to said source node of said bit-side auxiliary driver transistor and said source node of said bit-bar-side auxiliary driver transistor in a half-addressed SRAM cell and independently provide a second set of bias voltages to said source node of said bit-side auxiliary driver transistor and said source node of said bit-bar-side auxiliary driver transistor in an addressed SRAM cell.

3. The integrated circuit of claim 1, in which each said SRAM cell further includes a second bit-side passgate transistor, said second bit-side passgate transistor further including a gate node, a first source/drain node and a second source/drain node, wherein said first source/drain node of said second bit-side passgate transistor is connected to said bit-side data node, said second source/drain node of said second bit-side passgate transistor is connected to a second bit line, and said gate node of said second bit-side passgate transistor is connected to a third word line, such that a single sided write bit-side operation may be performed with said second bit line through said second bit-side passgate transistor.

4. The integrated circuit of claim 3, in which each said SRAM cell further includes a second bit-bar-side passgate transistor, said second bit-bar-side passgate transistor further including a gate node, a first source/drain node and a second source/drain node, wherein said first source/drain node of said second bit-bar-side passgate transistor is connected to said bit-bar-side data node, said second source/drain node of said second bit-bar-side passgate transistor is connected to a second bit-bar line, and said gate node of said second bit-bar-side passgate transistor is connected to a fourth word line, such that a single sided write bit-bar-side operation may be performed with said second bit-bar line through said second bit-bar-side passgate transistor.

5. The integrated circuit of claim 1, in which each said SRAM cell further includes a bit-side read buffer coupled to said bit-bar-side data node, said bit-side read buffer further including a bit-side access transistor and a bit-side read buffer driver transistor, wherein:
said bit-side access transistor includes a gate node, a first source/drain node and a second source/drain node, wherein said first source/drain node of said bit-side access transistor is connected to a second bit line and said gate node of said bit-side access transistor is connected to a third word line; and
said bit-side read buffer driver transistor includes a gate node and a source/drain node, wherein said gate node of said bit-side read buffer driver transistor is connected to said bit-bar-side data node and said source/drain node of said bit-side read buffer driver transistor is connected to said second source/drain node of said bit-side access transistor;
such that a read operation may be performed from said bit-bar-side data node through said bit-side read buffer to said second bit line.

6. The integrated circuit of claim 5, in which each said SRAM cell further includes a bit-bar-side read buffer coupled to said bit-side data node, said bit-bar-side read buffer further including a bit-bar-side access transistor and a bit-bar-side read buffer driver transistor, wherein:
said bit-bar-side access transistor includes a gate node, a first source/drain node and a second source/drain node, wherein said first source/drain node of said bit-bar-side access transistor is connected to a second bit-bar line and said gate node of said bit-bar-side access transistor is connected to a fourth word line; and
said bit-bar-side read buffer driver transistor includes a gate node and a source/drain node, wherein said gate node of said bit-bar-side read buffer driver transistor is connected to said bit-side data node and said source/drain node of said bit-bar-side read buffer driver transistor is connected to said second source/drain node of said bit-bar-side access transistor;
such that a read operation may be performed from said bit-bar-side data node through said bit-bar-side read buffer to said second bit-bar line.

7. The integrated circuit of claim 1, in which:
said bit-side driver transistor is an NMOS transistor;
said bit-side load transistor is a PMOS transistor;
said bit-bar-side driver transistor is an NMOS transistor;
said bit-bar-side load transistor is a PMOS transistor;
said bit-side auxiliary driver transistor is an NMOS transistor; and
said bit-bar-side auxiliary driver transistor is an NMOS transistor.

8. The integrated circuit of claim 1, in which:
said bit-side driver transistor is a PMOS transistor;
said bit-side load transistor is an NMOS transistor;
said bit-bar-side driver transistor is a PMOS transistor;
said bit-bar-side load transistor is an NMOS transistor;
said bit-side auxiliary driver transistor is a PMOS transistor; and
said bit-bar-side auxiliary driver transistor is a PMOS transistor.

9. An integrated circuit, comprising:
an array of SRAM cells, said SRAM cells being arranged in rows and columns, each said SRAM cell further including:
a bit-side driver transistor, said bit-side driver transistor further including a gate node, a source node and a drain node;
a bit-side data node, wherein said bit-side data node is connected to said drain node of said bit-side driver transistor;
a bit-side load transistor, said bit-side load transistor further including a gate node, a source node and a drain node, wherein said drain node of said bit-side load transistor is connected to said bit-side data node;
a bit-bar-side driver transistor, said bit-bar-side driver transistor further including a gate node, a source node and a drain node, wherein said gate node of said bit-bar-side driver transistor is connected to said bit-side data node;
a bit-bar-side data node, wherein said bit-bar-side data node is connected to said drain node of said bit-bar-side driver transistor, to said gate node of said bit-side driver transistor and to said gate node of said bit-side load transistor;
a bit-bar-side load transistor, said bit-bar-side load transistor further including a gate node, a source node and a drain node, wherein said drain node of said bit-bar-side load transistor is connected to said bit-bar-side data node, and said gate node of said bit-bar-side load transistor is connected to said bit-side data node;

a bit-side auxiliary driver transistor, said bit-side auxiliary driver transistor further including a gate node, a source node and a drain node, wherein said drain node of said bit-side auxiliary driver transistor is connected to said bit-side data node, and said gate node of said bit-side auxiliary driver transistor is connected to said bit-bar-side data node;

a bit-bar-side auxiliary driver transistor, said bit-bar-side auxiliary driver transistor further including a gate node, a source node and a drain node, wherein said drain node of said bit-bar-side auxiliary driver transistor is connected to said bit-bar-side data node, said gate node of said bit-bar-side auxiliary driver transistor is connected to said bit-side data node, and said source node of said bit-bar-side auxiliary driver transistor is connected to said source node of said bit-side auxiliary driver transistor;

a bit-side passgate transistor, said bit-side passgate transistor further including a gate node, a first source/drain node and a second source/drain node, wherein said first source/drain node of said bit-side passgate transistor is connected to said bit-side data node, said second source/drain node of said bit-side passgate transistor is connected to a bit line, and said gate node of said bit-side passgate transistor is connected to a first word line; and a bit-bar-side passgate transistor, said bit-bar-side passgate transistor further including a gate node, a first source/drain node and a second source/drain node, wherein said first source/drain node of said bit-bar-side passgate transistor is connected to said bit-bar-side data node, said second source/drain node of said bit-bar-side passgate transistor is connected to a bit-bar line, and said gate node of said bit-bar-side passgate transistor is connected to a second word line; and an auxiliary driver transistor bias circuit coupled to said array of SRAM cells, said auxiliary driver transistor bias circuit being configured to provide bias voltages to said source node of said bit-side auxiliary driver transistor and said source node of said bit-bar-side auxiliary driver transistor.

10. A process of operating an integrated circuit, comprising the steps of:

performing a single sided write bit-side low operation on an addressed SRAM cell, by a process including the step of biasing a source nodes of a bit-side auxiliary driver transistor and a source node of a bit-bar-side auxiliary driver transistor in a half-addressed SRAM cell to a low voltage;

performing a single sided write bit-side high operation on said addressed SRAM cell, by a process including the step of biasing said source node of said bit-side auxiliary driver transistor and said source node of said bit-bar-side auxiliary driver transistor in said half-addressed SRAM cell to a low voltage; and performing a read bit-side operation on said addressed SRAM cell, by a process including the steps of biasing said source node of said bit-side auxiliary driver transistor and said source node of said bit-bar-side auxiliary driver transistor in said half-addressed SRAM cell to a low voltage, and biasing a source node of a bit-side auxiliary driver transistor and a source node of a bit-bar-side auxiliary driver transistor in an addressed SRAM cell to a low voltage.

11. The process of claim 10, further including the step of transitioning said addressed SRAM cell and said half-addressed SRAM cell to a standby mode, by a process including the steps of floating said source node of said bit-side auxiliary driver transistor in said addressed SRAM cell, floating said source node of said bit-bar-side auxiliary driver transistor in said addressed SRAM cell, floating said source node of said bit-side auxiliary driver transistor in said half-addressed SRAM cell, floating said source node of said bit-bar-side auxiliary driver transistor in said half-addressed SRAM cell.

12. The process of claim 10, further including the step of transitioning said addressed SRAM cell and said half-addressed to a sleep mode, by a process including the steps of biasing said source node of said bit-side auxiliary driver transistor in said addressed SRAM cell to a voltage on said bit-side driver transistor in said addressed SRAM cell, biasing said source node of said bit-bar-side auxiliary driver transistor in said addressed SRAM cell to a voltage on said bit-bar-side driver transistor in said addressed SRAM cell, biasing said source node of said bit-side auxiliary driver transistor in said half-addressed SRAM cell to a voltage on said bit-side driver transistor in said half-addressed SRAM cell, biasing said source node of said bit-bar-side auxiliary driver transistor in said half-addressed SRAM cell to a voltage on said bit-bar-side driver transistor in said half-addressed SRAM cell.

13. The process of claim 10, in which said step of performing said single sided write bit-side low operation includes the step of floating said source node of said bit-side auxiliary driver transistor in said addressed SRAM cell.

14. The process of claim 10, in which said step of performing said single sided write bit-side low operation includes the step of floating said source node of said bit-bar-side auxiliary driver transistor in said addressed SRAM cell.

15. The process of claim 10, in which said step of performing said single sided write bit-side high operation includes the step of floating said source node of said bit-side auxiliary driver transistor in said addressed SRAM cell.

16. The process of claim 10, in which said step of performing said single sided write bit-side high operation includes the step of floating said source node of said bit-bar-side auxiliary driver transistor in said addressed SRAM cell.

17. The process of claim 10, in which:
said step of performing said single sided write bit-side low operation includes the step of biasing said source node of said bit-bar-side auxiliary driver transistor in said addressed SRAM cell to a high voltage; and
said step of performing said single sided write bit-side high operation includes the step of biasing said source node of said bit-side auxiliary driver transistor in said addressed SRAM cell to a high voltage.

18. The process of claim 10, in which said step of performing said single sided write bit-side low operation includes the step of determining if a low voltage was successfully transferred to a bit-side data node of said addressed SRAM cell.

19. The process of claim 10, in which said step of performing said single sided write bit-side high operation includes the step of determining if a high voltage was successfully transferred to a bit-side data node of said addressed SRAM cell.

20. The process of claim 10, in which said step of performing said read bit-side operation includes the step of determining if a voltage on a bit-side data node was successfully transferred to a bit data line of said addressed SRAM cell.

* * * * *